331-98

SEARCH ROOM

Dec. 27, 1960 | J. SCHACHTER | 2,966,635

ULTRA-HIGH FREQUENCY OSCILLATOR WITH
RESONANT CAVITY TUNING MEANS

Filed Aug. 16, 1957 | 2 Sheets-Sheet 1

INVENTOR
Jacob Schachter
BY Michael S. Striker
ATTORNEY

INVENTOR.
Jacob Schachter
BY Michael S. Striker
ATTORNEY 2,966,635
Patented Dec. 27, 1960

2,966,635

ULTRA-HIGH FREQUENCY OSCILLATOR WITH RESONANT CAVITY TUNING MEANS

Jacob Schachter, Whitestone, N.Y., assignor to Pitometer Log Corporation, New York, N.Y.

Filed Aug. 16, 1957, Ser. No. 678,635
4 Claims. (Cl. 331—98)

The present invention relates to an ultra-high frequency tube arrangement. More particularly, the present invention relates to an extremely stable ultra-high frequency oscillator.

Very stable ultra-high frequency oscillators have been used in conjunction with many electronic systems. For example, radar systems require stable oscillators which produce ultra-high frequency electromagnetic waves for accurate operation of the system. In addition, certain radar systems which are called Moving Target Indicator radar systems of the coherent type require unusually stable oscillators in order to accurately measure the phase relationship between successive radar impulses.

For certain types of radar systems it is necessary that oscillators be provided which have short term stability factors in the order of five parts in a billion. Conventional oscillators which have been constructed with the required accuracy are particularly sensitive to mechanical and acoustical disturbances. Since the oscillators have to be tuned over a particular frequency range, it is necessary to have tuning elements provided in conjunction with the oscillator. When the oscillator is mechanically disturbed the tuning elements which are generally located on control rods or shafts vibrate thereby destroying the short-term stability of the oscillator.

Ultra-high frequency oscillators usually use cavity resonators, the dimensions of which are varied by any mechanical disturbances. In addition, such mechanical disturbances can change the interelectrode spacing of the vacuum tube used in the oscillator apparatus.

It is therefore necessary with conventional oscillators to isolate the oscillator as much as possible and insulate the same from any mechanical disturbances. Accordingly, heavy castings for the resonant cavity bodies and particularly rugged type vacuum tubes are required.

The present invention overcomes these difficulties by providing an entirely new design and arrangement for generating the necessary ultra-high frequency electromagnetic waves. The tube is tuned over the desired frequency range by varying the interelectrode capacitance position in the electric field of the cavity resonator.

It is accordingly an object of the present invention to overcome the disadvantages of conventional ultra-high frequency oscillator arrangements.

A second object of the present invention is to provide a new and improved ultra-high frequency tube arrangement.

Another object of the present invention is to provide a particularly stable ultra-high frequency tube arrangement which is unaffected by normal mechanical disturbances.

A further object of the present invention is to provide an ultra-high frequency tube arrangement utilizing a tube having planar electrodes and which tube is arranged within the resonant cavity so that the frequency of the tube arrangement can be varied by varying the effective position of the interelectrode capacitance of the tube within the resonant cavity.

Still another object of the present invention is to provide an ultra-high frequency oscillator arrangement which can be tuned over the desired frequency range by changing the positions of the resonant cavity of the tube arrangement with respect to the tube itself.

With the above objects in view, the present invention mainly consists of an ultra-high frequency tube arrangement including a support means, a first resonating means arranged on the support means and being formed with a first resonant cavity therein. Second resonating means are provided mounted on the support means and spaced from the first resonating means, the second resonating means being formed with a second resonant cavity. Finally, ultra-high frequency tube means having at least an anode, a cathode, and a grid electrode forming an anode-grid interelectrode capacitance and a grid-cathode interelectrode capacitance is provided. The ultra-high frequency tube means is arranged on the support means with at least part of one of the interelectrode capacitances being in one of the resonant cavities. At least one of the means are movable with respect to the other means so that the interelectrode capacitance arranged in the resonant cavity can be moved into any one of a plurality of different effective positions in its respective resonant cavity, whenever desired.

In a preferred embodiment of the present invention, one of the resonating means includes a movable member for moving its respective resonant cavity with respect to the support means.

When the ultra-high frequency tube arrangement is utilized as an oscillator, feedback means are provided for coupling the two resonant cavities together so that electromagnetic energy developed in one of the cavities can be fed back to the other cavity.

The tube used in the present invention in preferably one having planar electrodes and the cavity resonators can be provided with planar spaced end walls. With such an arrangement, the planar electrodes can be easily coupled to the spaced end walls of the cavity resonator which can be a cylindrical cavity resonator.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings, in which:

Figure 1:
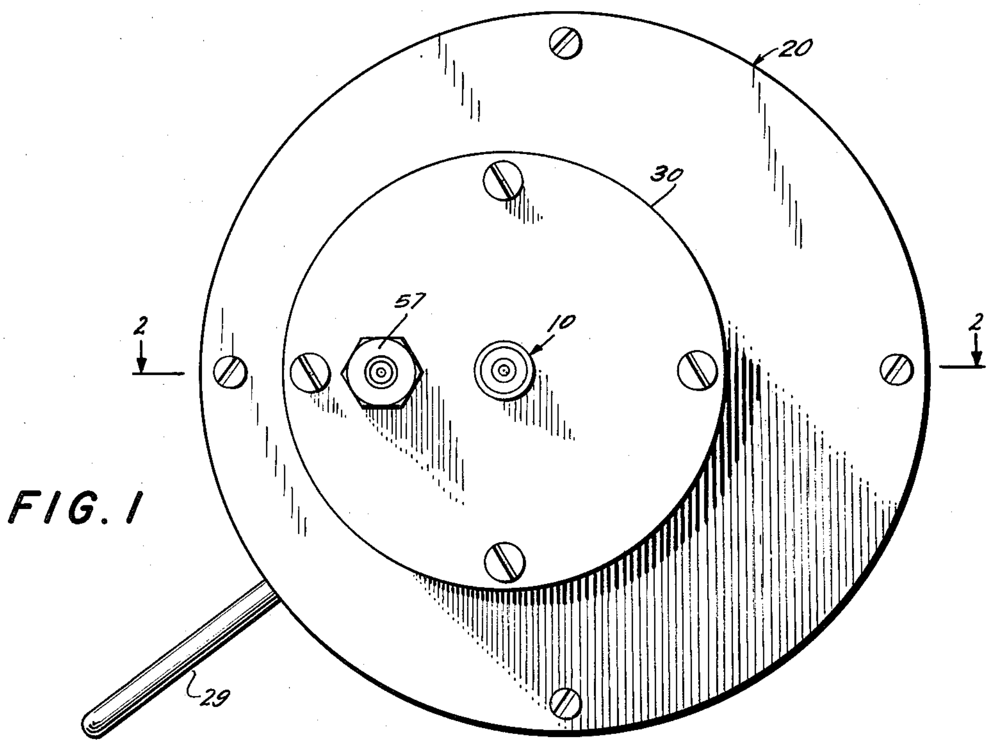
Fig. 1 is a plan view of the ultra-high frequency tube arrangement incorporating the principles of the present invention.
Figure 2:
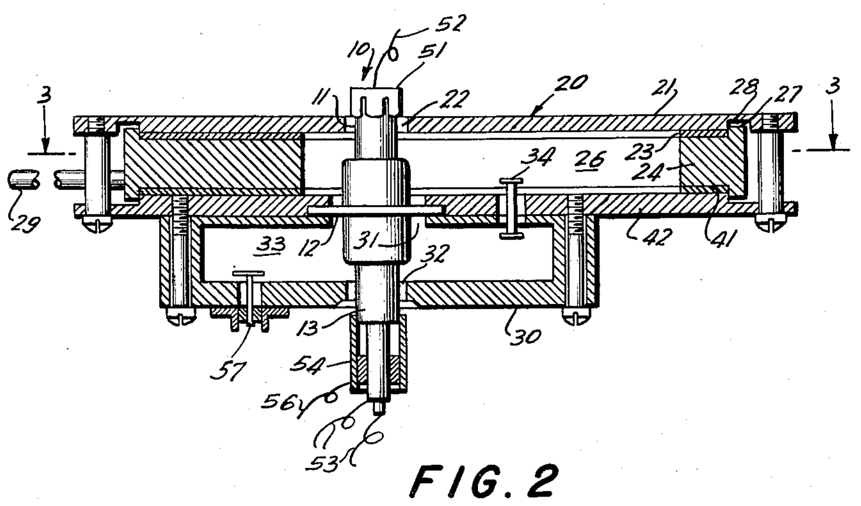
Fig. 2 is a sectional view taken along the line 2—2 of Fig. 1.

Referring to the drawings and more particularly to Figs. 1 and 2, it can be seen that the ultra-high frequency tube arrangement includes a tube 10 having planar electrodes including an anode 11, a grid 12, and a cathode electrode 13.

Surrounding the portion of the tube 10 between the anode 11 and the grid electrode 12 is a first resonating member 20 while a second resonating member 30 surrounds a second portion of the tube, namely the portion between the grid electrode 12 and the cathode electrode 13.

The first resonating member 20 is provided with a first disc-shaped end wall 21 having an opening 22 through which the anode electrode 11 of the tube 10 passes. Arranged beneath the end wall 21 in Fig. 2 is a disc-shaped bearing member 23, preferably made of a resin material such as "Teflon" which is a polytetrafluoroethylene resin. The function of the member 23 will be explained subsequently in the application.

Arranged below the disc-shaped member 23 in Fig. 2 is a rotatable member 24 being formed with an eccentrically located opening 26 therein. It can also be seen that the annular periphery of the rotating member 24 is provided with an enlarged portion 27 which cooperates with a groove 28 in the end wall 21. A handle 29 is provided for manually rotating the rotatable member 24 with respect to the end wall 21.

The resonating member 20 also includes a second disc-shaped member 41 which can advantageously be made of the same material as the member 23. The resonating member 20 is also provided with a second end wall 42 which it can be seen is spaced from the first end wall 21 so as to form between the spaced end walls 21 and 42, a grid-anode resonant cavity for the tube 10. It is clear that this grid-anode resonant cavity is also defined circumferentially by the eccentrically arranged opening 26 within the rotatable member 24.

Mounted on the end wall 42 which also forms support means for the grid electrode 12 of the tube 10, is the second resonating member 30 which is formed with aligned axial openings 31 and 32 to permit the passage of the portion of the tube 10 between the grid electrode 12 and the cathode electrode 13. The resonating means 30 is formed with an inner chamber 33 to provide a grid-cathode resonant cavity for the tube 10. Feedback means between the grid-anode cavity 26 and the grid-cathode cavity 33 is provided by a feedback loop 34 which is arranged to feedback a portion of the electromagnetic energy developed in the resonant cavity 33 to the grid-anode cavity 26.

Arranged on the anode 11 is a cap 51 to which is connected a conductor 52 for supplying operating potential to the tube 10. In addition, filament conductors 53 are provided for heating the filament arranged adjacent the cathode 13 of the tube 10. Potential connections to the cathode 13 can be made by the cathode sleeve 54 to which is attached a conductor 56.

When the tube arrangement is operating, output from the tube arrangement can be taken from the output connector 57 which is coupled to the grid-cathode cavity 33 through the wall of the resonating means 30.

The arrangement shown in the drawings provides a tunable ultra-high frequency oscillator. The anode and grid of the tube 10 form between themselves an anode-grid interelectrode capacitance which as can best be seen in Fig. 2 is arranged within the grid-anode resonant cavity 26.

Similarly, the grid and cathode electrodes of the tube 10 form between themselves a grid-cathode interelectrode capacitance which is arranged within the grid-cathode resonant cavity 33.

This tube arrangement can be tuned by changing the effective position of the interelectrode capacitances of the tube with respect to their respective resonant cavities. When the tube is in the highest electrostatic field of the cavity, the effect of the tube interelectrode capacitance is the greatest. As the effective position of the tube is moved from this position the effect of the interelectrode capacitance is decreased and the frequency to which the resonant cavity is tuned and accordingly the output frequency of the tube arrangement is decreased.

Figure 3:
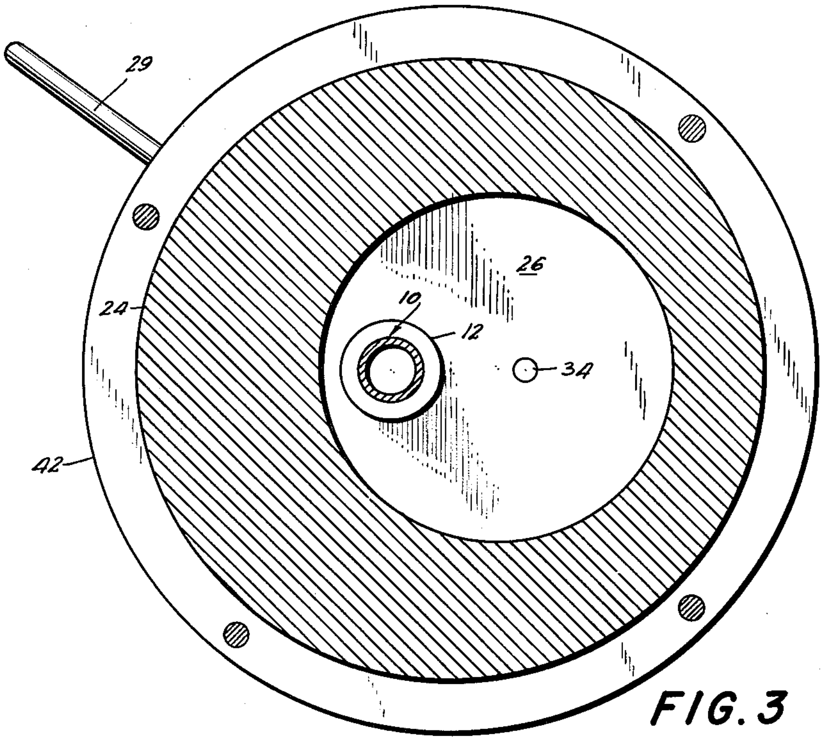
Fig. 3 is a sectional view taken along the line 3—3 of Fig. 2.
Figure 4:
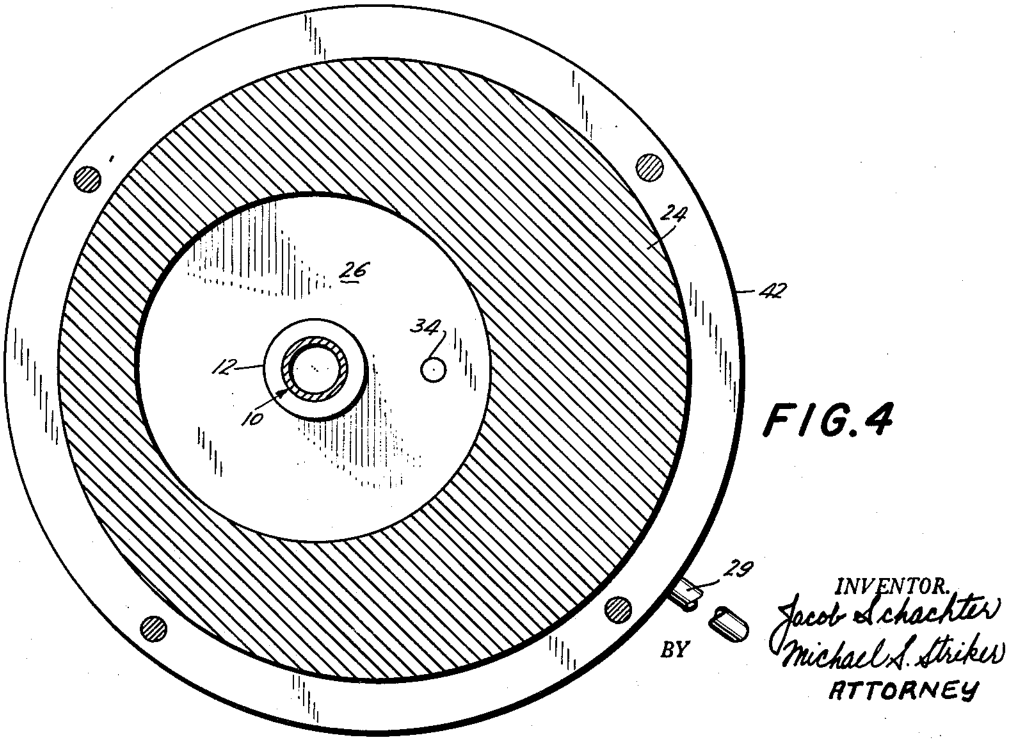
Fig. 4 is a view similar to Fig. 3 except that the cavity resonator has been rotated approximately 180°.

The method by which the effective position of the interelectrode capacitances of the tube within their respective resonant cavities can be changed can best be seen in Figs. 3 and 4. Referring to Fig. 3, the eccentric opening 26 within the member 24 can be clearly seen. In the position of the rotatable member 24, it is apparent that the tube 10 is positioned near the boundary wall of the grid-anode resonant cavity. The tube 10 is fixedly mounted on the lower end wall 42 and the member 24 is therefore rotatable with respect to the end wall 42 and the tube 10.

Referring now to Fig. 4, the apparatus of Fig. 3 is shown wherein the rotatable member 24 has been rotated by means of the manually operable handle 29. In Fig. 4 it can be seen that the effective position of the tube 10 with respect to the resonant cavity 26 has been changed from the boundary wall to substantially the center of the resonant cavity. It is accordingly clear that the effect of the interelectrode capacitance of the tube 10 is different on the tuned resonant cavity 26 for the two positions shown in Figs. 3 and 4.

It is therefore apparent that with the apparatus shown in Figs. 1–4 an ultra-high frequency oscillator arrangement has been provided wherein the frequency of the oscillator arrangement may be tuned throughout a desired range without utilizing any slugs or chokes into the high "Q" resonant cavity 26. It is also apparent that the only parts of the apparatus which enter this high "Q" cavity are the feedback probe 34 and the tube 10.

As is apparent from Fig. 2, the output coupling is achieved in the grid-cathode resonant cavity which has a lower "Q" and therefore is less adversely affected by the output coupling mounting. It should be noted that the grid-cathode resonant cavity of the apparatus shown has substantially fixed dimensions and no movable parts. The design for the grid-cathode resonant cavity is preferably optimized near the center of the frequency range desired for the ultra-high frequency oscillator.

The arrangement shown in the drawings has many features which overcome the critical shock-vibration and acoustical disturbances which normally deteriorate the stability of highly stable oscillators. Since there are no tuning elements such as slugs or chokes in the high-Q cavity 26 is is apparent that it is not necessary to have any connecting tuning rods or shafts to act as tuning forks. That is these rods would vibrate at a particular mechanical resonant frequency and offset the tuning of the resonant cavity when they are used.

In the sectional view shown in Fig. 2 it should be noted that the rotatable member 24 rotates on bearing surfaces which are provided by the disc-shaped members 23 and 41. Since these disc-shaped members are advantageously made of a polytetrafluoroethylene resinous material they provide a smooth bearing surface having a very low coefficient of friction. In addition, the members 23 and 41 act as capacitors between the plates 21 and 24 and 24 and 42 respectively to continue the electrical connections of the resonant cavity 26.

With the planar triode such as the General Electric tube Number 6442, the tube can be held solidly in position on the member 42 by the cooperation of the resonating member 30 with the grid electrode 12 of the tube 10. This particular tube has a low filament-cathode capacitance so that raw alternating current can be used directly on the filaments of the tube.

In one embodiment which was constructed using the principles of the described invention, the mid-frequency tuning point was 1570 megacycles per second. The tuning range for the oscillator arrangement was approximately 17% with a RF power output of 1.0 watt at the mid band frequency. Raw 60 cycles per second alternating current was used on the filaments and the tube exhibited a short term stability of 15–20 cycles per second peak. This embodiment used silver plated brass for the portions of the members bounding the resonant cavity 26 and "Teflon" for the members 23 and 41.

The invention has been described as applied to an oscillator arrangement. However it is aparent that the ruggedness and unusual mechanical stability of the tube permits the utilization of the design for other types of ultra-high frequency tube arrangements such as amplifiers, etc.

The means for rotating the member 24 is shown as a manually operable handle 29 in the drawings. However, it is clear that any other arrangement having good mechanical stability can be utilized. For example the outer periphery of the member 24 can be formed with gear teeth which cooperate with a pinion for rotating the member 24. In such an arrangement an accurate calibration of an indicator plate can be provided if desired. It should also be noted that in such an arrangement the frequency can be continuously tuned throughout the entire range.

In the embodiment illustrated and described, the tube 10 is indicated as being fixedly mounted while the effective position of the tube in the resonant cavity is changed by rotating the resonant cavity about the tube. The resonant cavity need not necessarily be rotated but might be moved transversely, for example. In addition, an arrangement might be provided wherein the tube is moved while the resonant cavity is held stationary. Similarly, different types of ultra-high frequency tubes may be used with the variable cavity resonator arrangement. For example, a magnetron tube, a klystron tube or similar tubes may be used.

If desired, automatic frequency control could be readily applied to the tube arrangement when it is operated as an oscillator.

It will be understood that each of the elements described above, or two or more together, may also find a useful application in other types of ultra-high frequency apparatus differing from the types described above.

While the invention has been illustrated and described as embodied in ultra-high frequency oscillator arrangement, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be secured by Letters Patent is:

1. In an ultra-high frequency tube arrangement in combination, support means; first rigid resonating means formed with spaced planar end walls and including a rigid movable member with a first cylindrical resonant cavity therein and movable between said spaced planar end walls which constitute end walls of said cavity; second rigid resonating means mounted on one of said end walls of said first resonating means and being formed with a second resonant cavity; and ultra-high frequency tube means having at least an anode, a cathode, and a grid electrode forming an anode-grid interelectrode capacitance and a grid-cathode interelectrode capacitance, said ultra-high frequency tube means being arranged stationarily on one of said end walls with said anode electrode being arranged adjacent to the other one of said planar end walls of said first resonant cavity and said grid electrode being arranged adjacent and connected to said one planar end wall of said first resonant cavity so that said anode-grid interelectrode capacitance is arranged in said first resonant cavity, said movable member being rotatingly movable with respect to said tube means about an axis of rotation spaced from the center of said first resonant cavity and from said tube means so that said anode-grid interelectrode capacitance arranged in said first resonant cavity can be caused to be positioned in any one of a plurality of different effective positions relative to said first resonant cavity by moving said movable member into correspondingly different positions relative to said tube means, whenever desired.

2. In an ultra-high frequency tube arrangement in combination; first rigid resonating means formed with spaced planar end walls and including a rigid movable member with a first cylindrical resonant cavity therein and movable between said end walls which constitute the end walls of said cavity; second rigid resonating means mounted on one of said end walls of said first resonating means and being formed with a second cylindrical resonant cavity having spaced planar end walls; and ultra-high frequency tube means having at least an anode, a cathode, and a grid electrode forming an anode-grid interelectrode capacitance and a grid-cathode interelectrode capacitance, said ultra-high frequency tube means being arranged stationarily on one of said end walls with said anode electrode arranged adjacent to the other one of said planar end walls of said first resonant cavity and said grid electrode being arranged adjacent and connected to said one planar end wall of said first resonant cavity so that said anode-grid interelectrode capacitance is arranged in said first resonant cavity, said grid electrode also being arranged adjacent and connected to one of said end walls of said second resonant cavity, said cathode electrode being arranged adjacent to the other end wall of said second resonant cavity so that said grid-cathode interelectrode capacitance is arranged in said second resonant cavity, said movable member being rotatingly movable with respect to said tube means about an axis of rotation spaced from the center of said first resonant cavity and from said tube means so that at least one of said interelectrode capacitances can be caused to be positioned in any one of a plurality of different effective positions relative to said first resonant cavity, by moving said movable member into correspondingly different positions relative to said tube means whenever desired.

3. In an ultra-high frequency oscillator arrangement in combination, support means; first rigid resonating means arranged on said support means and being formed with spaced planar end walls and including a rigid movable member with a first cylindrical resonant cavity therein and movable between said spaced planar end walls which constitute the end walls of said cavity; second rigid resonating means mounted on said support means spaced from said first resonating means and being formed with a second resonant cavity; ultra-high frequency tube means having at least an anode, a cathode, and a grid electrode forming an anode-grid interelectrode capacitance and a grid-cathode interelectrode capacitance, said ultra-high frequency tube means being arranged on said support means with said anode electrode being arranged adjacent to one of said planar end walls of said first resonant cavity and said grid electrode being arranged adjacent and connected to the other one of said planar end walls of said first resonant cavity so that said anode-grid interelectrode capacitance is arranged in said first resonant cavity, said movable member being rotatingly movable with respect to said tube means about an axis of rotation spaced from the center of said first resonant cavity and from said tube means so that said anode-grid interelectrode capacitance arranged in said first resonant cavity can be caused to positioned in any one of a plurality of different effective positions relative to said first resonant cavity by moving said movable member into correspondingly different positions relative to said tube means, whenever desired; and feedback means coupling said first and second resonant cavities together so that at least a portion of any electromagnetic energy developed in one of said cavities is fed back to the other of said cavities.

4. In an ultra-high frequency oscillator arrangement in combination; first rigid resonating means formed with spaced planar end walls and including a rigid movable member with a first cylindrical resonant cavity therein and movable between said end walls which constitute the end walls of said cavity; second rigid resonating means mounted on one of said end walls of said first resonating means and being formed with a second cylindrical resonant cavity having spaced planar end walls; ultra-high frequency tube means having at least an anode, a cathode, and a grid electrode forming an anode-grid interelectrode capacitance and a grid-cathode interelectrode capacitance, said ultra-high frequency tube means being arranged stationarily on one of said end walls with said anode electrode arranged adjacent to the other one of said planar end walls of said first resonant cavity and said grid electrode being arranged adjacent and connected to said one planar end wall of said first resonant cavity so that said anode-grid interelectrode capacitance is arranged in said first resonant cavity, said grid electrode also being arranged adjacent and connected to one of said end walls of said second resonant cavity, said cathode electrode being arranged adjacent to the other end wall of said second resonant cavity so that said grid-cathode interelectrode capacitance is arranged in said second resonant cavity, said movable member being rotatingly movable with respect to said tube means about an axis of rotation spaced from the center of said first resonant cavity and from said tube means so that at least one of said interelectrode capacitances can be caused to be positioned in any one of a plurality of different effective positions relative to said first resonant cavity, by moving said movable member into correspondingly different positions relative to said tube means, whenever desired; and feedback means coupling said first and second resonant cavities together so that at least a portion of any electromagnetic energy developed in one of said cavities is fed back to the other of said cavities.

References Cited in the file of this patent

UNITED STATES PATENTS

| | | |
|---|---|---|
| 2,404,261 | Whinnery | July 16, 1946 |
| 2,487,619 | Usselman | Nov. 8, 1949 |
| 2,520,147 | Isely | Aug. 29, 1950 |
| 2,525,806 | Kumpfer | Oct. 17, 1950 |
| 2,561,727 | Cooper et al. | July 24, 1951 |